(12) United States Patent
Ishizuka

(10) Patent No.: US 6,198,418 B1
(45) Date of Patent: Mar. 6, 2001

(54) DIGITAL-TO ANALOG CONVERTER ACCURATELY TESTABLE WITHOUT COMPLICATED CIRCUIT CONFIGURATION, SEMICONDUCTOR INTEGRATED CIRCUIT DEVICE USING THE SAME AND TESTING METHOD THEREOF

(75) Inventor: Satoshi Ishizuka, Kanagawa (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/256,590

(22) Filed: Feb. 23, 1999

(30) Foreign Application Priority Data

Feb. 26, 1998 (JP) .................................................. 10-045653

(51) Int. Cl.[7] .................................................. H03M 1/66
(52) U.S. Cl. .......................................... 341/144; 341/126
(58) Field of Search ................................. 341/144, 118, 341/117, 126, 154, 172

(56) References Cited

U.S. PATENT DOCUMENTS

| | | | |
|---|---|---|---|
| 4,468,652 | * 8/1984 | Wang et al. | ........................... 341/144 |
| 4,521,765 | * 6/1985 | Wang et al. | ........................... 341/144 |
| 4,751,497 | * 6/1988 | Torii | ..................................... 341/144 |
| 5,585,795 | * 12/1996 | Yuasa et al. | ........................... 341/144 |
| 5,729,231 | * 3/1998 | Kikuchi | ............................... 341/144 |

FOREIGN PATENT DOCUMENTS

| | | |
|---|---|---|
| 60-87528 | 5/1985 | (JP) . |
| 63-193615 | 8/1988 | (JP) . |
| 2-305030 | 12/1990 | (JP) . |
| 5-6375 | 1/1993 | (JP) . |

* cited by examiner

*Primary Examiner*—Michael Tokar
*Assistant Examiner*—Jean Bruner Jeanglaude

(57) ABSTRACT

A digital-to-analog converter has two power supply nodes connected through a ladder-type resistor network to n-p-n bipolar transistors supplied with a reference voltages and directly supplied to n-p-n bipolar transistors responsive to a digital input signal, respectively, when a manufacturer tests the digital-to-analog converter, the tester sequentially changes the value of the digital input signal, and an ammeter measures the amount of electric current flowing through the ladder-type resistor network into the n-p-n bipolar transistors for accurately diagnosing the digital-to-analog converter on the basis of the variation of the electric current.

26 Claims, 5 Drawing Sheets

DIGITAL-TO ANALOG CONVERTER ACCURATELY TESTABLE WITHOUT COMPLICATED CIRCUIT CONFIGURATION, SEMICONDUCTOR INTEGRATED CIRCUIT DEVICE USING THE SAME AND TESTING METHOD THEREOF

FIELD OF THE INVENTION

This invention relates to a digital-to-analog converter and, more particularly, to a digital-to-analog converter accurately testable, a semiconductor integrated circuit device with the digital-to-analog converter and a method for testing the digital-to-analog converter.

DESCRIPTION OF THE RELATED ART

Various kinds of semiconductor integrated circuit device have been developed. A kind of semiconductor integrated circuit device includes digital circuits and a digital-to-analog converter. The digital circuits process pieces of data for producing an output digital signal, and the digital-to-analog converter converts the output digital signal to an analog output signal. The analog output signal is supplied from the semiconductor integrated circuit device. This feature is desirable for an audio signal or a video signal.

The manufacturer tests products before delivery to a customer. The semiconductor integrated circuit device with the digital circuits and the digital-to-analog converter is tested by using a digital tester for both of the digital circuits and the digital-to-analog converter, a digital tester for the digital circuits and an analog tester for the digital-to-analog converter, a tester for an analog-and-digital hybrid circuit or a built-in tester.

If the manufacturer uses the digital tester for the semiconductor integrated circuit device, the digital tester accurately tests the digital circuits. However, the digital tester is less reliable in the test for the digital-to-analog converter, because the voltage resolution is rough. On the other hand, when the digital tester and the analog tester are used for the semiconductor integrated circuit device, the test is so expensive, because the manufacturer requires both digital and analog testers and two kinds of test programs.

The tester for an analog-and-digital hybrid circuit is sold at high price, and the test is also expensive. The built-in tester requires additional area on the semiconductor chip, and a large semiconductor chip is required. Moreover, the built-in tester is not removed from the semiconductor integrated circuit device after the test. The built-in tester has undesirable influence on the digital-to-analog converter, and deteriorates the digital-to-analog converter. Thus, there is a trade-off between those testing methods.

FIG. 1 illustrates a typical example of the digital-to-analog converter. The prior art digital-to-analog converter includes a ladder-type resistor network 1, pairs of bipolar transistors 2/ 3/ 4/ 5 connected in parallel to the ladder-type resistor network 1 and constant current sources 6/ 7/ 8/ 9 connected between the pairs of resistors bipolar transistors 2/ 3/ 4/ 5 and a ground line GND. Two kinds of resistor elements, one of which is twice larger in resistance than the other, are incorporated in the ladder-type resistor network 1, and the ladder-type resistor network 1 includes resistor elements R1/ R2/ R3/ R4 connected at first ends thereof to a power supply line VDD and resistor elements R5/ R6/ R7 connected between the second ends of the resistor elements R1/ R2/ R3/ R4. In this instance, the resistor element R2/ R3/ R4 is twice larger in resistance than the resistor R1/ R5/ R6/ R7. The second end of the resistor element R4 is connected to an output node N1 and a test node N2. The output node N1 is connected to another electric circuit integrated on the same semiconductor chip, and the test node N2 is connected to a test pin (not shown).

The pairs of bipolar transistors 2 to 5 have first n-p-n bipolar transistors 2a/ 3a/ 4a/ 5a and second n-p-n bipolar transistors 2b/ 3b/ 4b/ 5b. The collector nodes of the first n-p-n bipolar transistors are connected to the power voltage line VDD, and the second ends of the resistor elements R1/ R2/ R3/ R4 are respectively connected to the collector nodes of the second n-p-n bipolar transistors 2b/ 3b/ 4b/ 5b. The common emitter nodes of the first/ second n-p-n bipolar transistors 2a/ 2b, 3a/ 3b, 4a/ 4b and 5a/ 5b are connected to the constant current sources 6/ 7/ 8/ 9, respectively. Data input nodes IN1/ IN2/ IN3/ IN4 are respectively connected to the base nodes of the first n-p-n bipolar transistors 2a/ 3a/ 4a/ 5a, and reference node REF is connected to the base nodes of the second n-p-n bipolar transistors 2b/ 3b/ 4b/ 5b. Constant reference voltage Vref is applied from the reference node REF to the base nodes of the second n-p-n bipolar transistors 2b/ 3b/ 4b/ 5b. A digital input signal is applied to the data input nodes IN1/ IN2/ IN3/ IN4, and the digital bits of the digital input signal are changed between a high level and a low level. In this instance, the high level is 2.4 volts, and the low level is 2.1 volts. The reference voltage Vref is regulated to an intermediate level between the high level and the low level, and is 2.1 volts in this instance.

The prior art digital-to-analog converter behaves as follows. Either first or second n-p-n bipolar transistor 2a, 3a, 4a, 5a/ 2b, 3b, 4b, 5b turns on, and the other n-p-n bipolar transistor turns off. If the digital bit of the high level is applied to the data input node IN1, the first n-p-n bipolar transistor 2a turns on, and the second n-p-n bipolar transistor 2b turns off. On the contrary, if the digital bit at the data input node IN1 is in the low level, the first n-p-n bipolar transistor 2a turns off; and the second n-p-n bipolar transistor 2b turns on. In this way, each pair of bipolar transistors 2/ 3/ 4/ 5 provides a current path in either first or second n-p-n bipolar transistor.

When the first n-p-n bipolar transistor 2a/ 3a/ 4a/ 5a turns on, electric current flows from the power voltage line VDD through the associated constant current source 6/ 7/ 8/ 9, and any electric current does not flow through the ladder-type resistor network 1. On the contrary, when the second n-p-n type bipolar transistor 2b/ 3b/ 4b/ 5b turns on, the electric current flows from the power supply line VDD through the ladder-type resistor network 1 to the associated constant current source 6/ 7/ 8/ 9.

The digital bits cause the pairs of bipolar transistors 2/ 3/ 4/ 5 to provide the current paths through the first n-p-n bipolar transistors 2a/ 3a/ 4a/ 5a or the second n-p-n bipolar transistors 2b/ 3b/ 4b/ 5b, and the total amount of electric current is varied together with the values of the digital input signal. The ladder-type resistor network 1 varies the potential level at the output/ test nodes N1/ N2 depending upon the total amount of current, and an analog output voltage signal is taken out from the output node N1 and the test node N2. Thus, the ladder-type resistor network 1 determines the resolution of the analog output voltage signal.

A standard digital tester has a resolution lower than the resolution of the latter-type resistor network 1, and it is impossible to accurately examine the prior art analog-to-digital converter on the basis of the analog output voltage signal. For this reason, the manufacturer has to prepare a high-precision digital tester, an analog-tester or an analog-and-digital hybrid tester, and these testers are expensive.

If the prior art digital-to-analog converter is integrated on a semiconductor chip together with digital circuits, the digital circuits are undesirable noise sources to the prior art digital-to-analog converter, and the analog output voltage signal is sensitive to the noise. The manufacturer needs to carefully design the layout on the semiconductor chip and signal lines therebetween. Even though the manufacturer carefully designs the semiconductor integrated circuit device, it is impossible to perfectly eliminate undesirable influences of the digital circuits from the integrated circuit.

Another prior art digital-to-analog converter is disclosed in Japanese Patent Publication of Examined Application No. 5-6375, and FIG. 2 illustrates the prior art digital-to-analog converter disclosed in the Japanese Patent Publication of Examined Application. The prior art digital-to-analog converter is labeled with reference numeral 11 in FIG. 2, and is broken down into a ladder type resistor network 12, an array 13 of constant current sources and an array 14 of switching elements. Resistor elements R1/ R2/ R3/ R4/ R5/ R6/ R7 form the ladder-type resistor network 12, and the resistor elements R1/ R3/ R5 and the resistor element R7 are respectively connected to bias nodes N10/N11. The resistor elements R6/ R7 are connected through an output node N12 to an electric circuit 15 to be controlled. Two bias voltage sources 16/ 17 are connected to the bias nodes N10/N11, respectively, and electric current flows from the bias voltage sources 16/ 17 through the bias nodes N10/ N11 to the ladder-type resistor network 12.

The array 13 includes constant current sources 13a, 13b, 13c and 13d, and the resistors R1/ R2, R3/ R4, R5/ R6 and R7/ R6 are connected to the constant current sources 13a/ 13b/ 13c/ 13d, respectively. Switching elements 14a/ 14b/ 14c/ 14d are connected between the constant current sources 13a/ 13b/ 13c/ 13d and a ground line GND. Data signals D0/ D1/ D2/ D3 are supplied to the switching elements 14a/ 14b/ 14c/ 14d, respectively, and the switching elements 14a/ 14b/ 14c/ 14d are selectively changed between on-state and off-state depending upon the voltage level of the data signals D0/ D1/ D2/ D3. The bias voltage source 16 includes an operational amplifier 16 a, an n-p-n bipolar transistor 16b and a constant current source 16c. A electric power source 18 is connected to the non-inverted input node of the operational amplifier 16a, and the inverted input node of the operational amplifier 16a is connected through the emitter node of the n-p-n bipolar transistor 16b to the bias node N1 . A power supply node VCC is connected to the collector node of the n-p-n bipolar transistor 16b, and the output node of the operational amplifier 16a is connected to the base node of the n-p-n bipolar transistor 16b. The emitter node is connected through the constant current source 16c to the ground line GND. Even if the current supplied to the bias node N10 is decreased to zero, the constant current source 16c keeps the n-p-n bipolar transistor 16b in the on-state. The other bias source 17 also includes an operational amplifier 17a, an n-p-n bipolar transistor 17b and a constant current source 17c. The electric power source 18 is connected to the non-inverted input node of the operational amplifier 17a, and the inverted input node of the operational amplifier 17a is connected through the emitter node of the n-p-n bipolar transistor 17b to the other bias node N11. The collector node of the n-p-n bipolar transistor 17b is connected through a measuring node N13 to an ammeter 19, and the output node of the operational amplifier 17a is connected to the base node of the n-p-n bipolar transistor 17b. The emitter node is connected through the constant current source 17c to the ground line GND. Even if the current supplied to the bias node N11 is decreased to zero, the constant current source 17c keeps the n-p-n bipolar transistor 17b in the on-state. Another power source 20 is connected to the power supply node VCC and the ammeter 19. The bias sources 16/ 17 supplies bias voltage equal to the output voltage E2 of the power source 18 to the bias nodes N10/N11.

The prior art digital-to-analog converter 11 is tested as follows. The voltage level at the bias node N11 is equal to the output voltage level E2, and is constant. Electric current flows through the resistor element R7 into the output node N12, and the variation of electric current is measured by the ammeter 19. The manufacturer checks the ammeter 19 to see whether electric characteristics of the prior art digital-to-analog converter 11 are acceptable or not.

When the data signals D0/ D1/ D2/ D3 are (0, 0, 0, 0), the minimum electric current flows through the resistor element R7. The amount of current is stepwise increased depending upon the data signals D0/ D1/ D2/ D3, and is maximized at (1, 1, 1, 1). For this reason, the manufacturer changes the data signal D0/ D1/ D2/ D3 from (0, 0, 0, 0) to (1, 1, 1, 1), and checks the ammeter 19 to see whether or not the amount of current is stepwise increased depending upon the data signals D0/ D1/ D2/ D3.

Thus, the manufacturer checks the electric characteristics of the digital-to-analog converter 11 through the electric current in order to overcome the problems inherent in the first prior art digital-to-analog converter. However, the second prior art digital-to-analog converter 11 requires the two bias sources 16/ 17, and the two bias sources 16/ 17 are integrated together with the digital-to-analog converter 11. This results in a large semiconductor chip. Another problem inherent in the second prior art digital-to-analog converter 11 is a difference in characteristics between the bias sources 16 and 17 due to the relative position with respect to the digital-to-analog converter 11, influences of other circuits and fluctuation of the power voltage. When the bias sources 16/ 17 differently exhibit the performance, the second prior art digital-to-analog converter 11 is deteriorated. The first prior art digital-to-analog converter shown in FIG. 1 further has a problem in that the test pin connected to the test node N2 is necessary for the package. Although the test pin is used in the measurement, only, the manufacturer is required to prepare the test pin, and the test pin makes the pin arrangement complicated.

SUMMARY OF THE INVENTION

It is therefore an important object of the present invention to provide a digital-to-analog converter, which is accurately testable without built-in circuit and deterioration of electric characteristics.

It is also an important object of the present invention to provide a semiconductor integrated circuit device, in which the digital-to-analog converter is incorporated.

It is also an important object of the present invention to provide a method for testing the semiconductor integrated circuit device.

To accomplish the object, the present invention proposes to independently supply electric current to a ladder-type resistor network and switching elements responsive to a digital input signal.

In accordance with one aspect of the present invention, there is provided a digital-to-analog converter comprising a first power supply node supplied with a first electric current from an electric power source outside thereof, a second power supply node electrically isolated from the first power supply node and supplied with a second electric current from the electric power source, an output node for supplying an analog output signal therefrom to outside thereof, a resistor circuit connected between the first power supply node and the output node for producing the analog output signal from the first electric current, a plurality of constant current sources connected in parallel to a third power supply node different in potential level from the first power supply node and the second power supply node, and a switching circuit including a plurality of first switching elements connected between the second power supply node and the plurality of constant current sources and respectively supplied with data bits of a digital input signal for changing current paths thereof between on-state and off-state depending upon the data bits and a plurality of second switching elements respectively paired with the plurality of first switching elements, connected between the resistor circuit and the plurality of constant current sources and supplied with a reference voltage for changing current paths thereof between the on-state and the off-state complementarily to the associated first switching elements.

In accordance with another aspect of the present invention, there is provided a semiconductor integrated circuit device fabricated on a single semiconductor substrate comprising a digital-to-analog converter including a first power supply node supplied with a first electric current from an electric power source outside thereof, a second power supply node electrically isolated from the first power supply node and supplied with a second electric current from the electric power source, an output node for supplying an analog output signal therefrom to outside thereof, a plurality of constant current sources connected in parallel to a third power supply node different in potential level from the first power supply node and the second power supply node and a switching circuit having a plurality of first switching elements connected between the second power supply node and the plurality of constant current sources and respectively supplied with data bits of a digital input signal for changing current paths thereof between on-state and off-state depending upon the data bits and a plurality of second switching elements respectively paired with the plurality of first switching elements, connected between a resistor circuit connected between the first power supply node and the output node and the plurality of constant current sources and supplied with a reference voltage for changing current paths thereof between the on-state and the off-state complementarily to the associated first switching elements.

In accordance with yet another aspect of the present invention, there is provided a method for testing a digital-to-analog converter comprising a first power supply node supplied with a first electric current, a second power supply node electrically isolated from the first power supply node and supplied with a second electric current, an output node for supplying an analog output signal therefrom to outside thereof, a resistor circuit connected between the first power supply node and the output node for producing the analog output signal from the first electric current, a plurality of constant current sources connected in parallel to a third power supply node and a switching circuit including a plurality of first switching elements connected between the second power supply node and the plurality of constant current sources and respectively supplied with data bits of a digital input signal for changing current paths thereof between on-state and off-state depending upon the data bits and a plurality of second switching elements respectively paired with the plurality of first switching elements, connected between the resistor circuit and the plurality of constant current sources and supplied with a reference voltage for changing current paths thereof between the on-state and the off-state complementarily to the associated first switching elements, comprising the steps of: connecting the first power supply node and the second power supply node to a first source of electric power and the third power supply node to a second source of electric power different in power level from the first source of electric power; changing the value of the digital input signal for measuring a variation of the first electric current; and diagnosing the digital-to-analog converter on the basis of the variation of the first electric current.

BRIEF DESCRIPTION OF THE DRAWINGS

The features and advantages of the digital-to-analog converter will be more clearly understood from the following description taken in conjunction with the accompanying drawings in which.

DESCRIPTION OF THE PREFERRED EMBODIMENTS

First Embodiment

Figure 1:
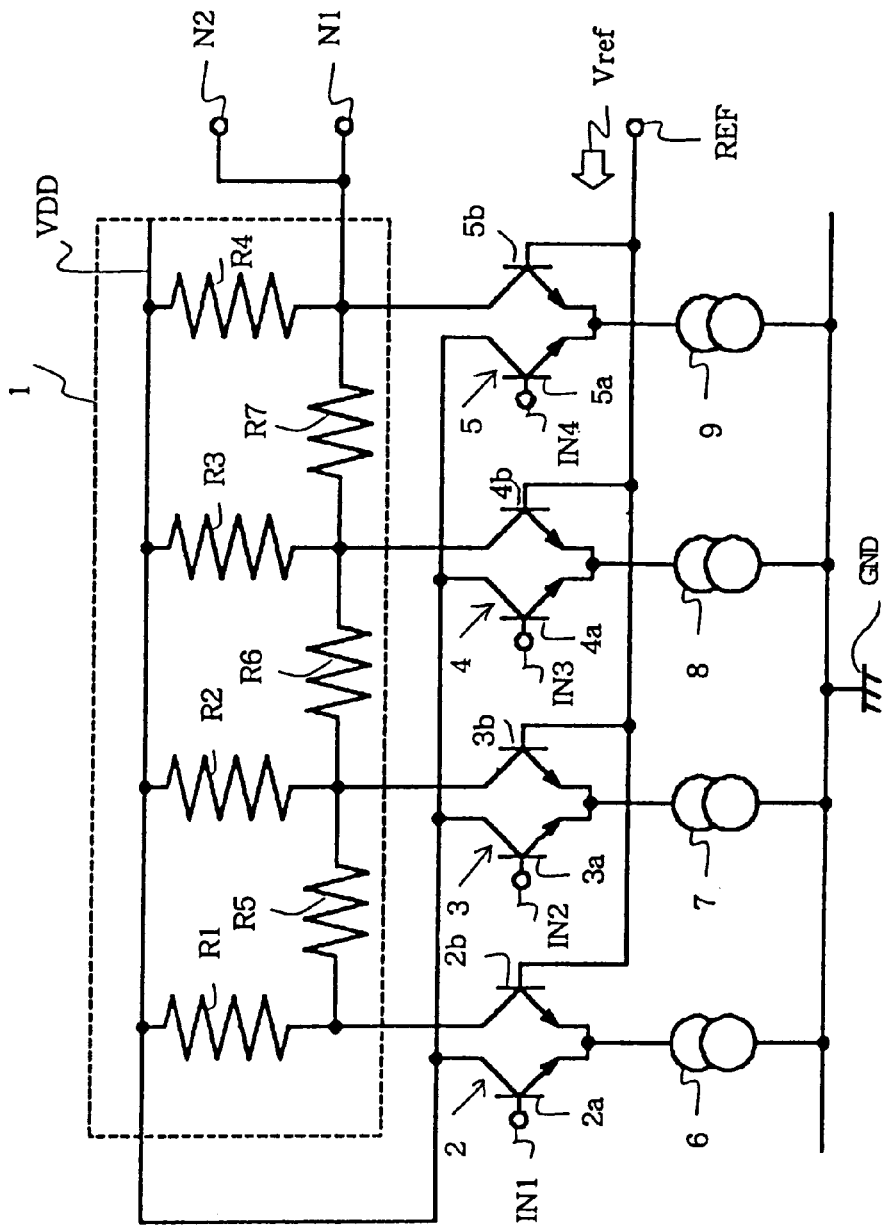
FIG. 1 is a circuit diagram showing the circuit configuration of the prior art digital-to-analog converter.
Figure 2:
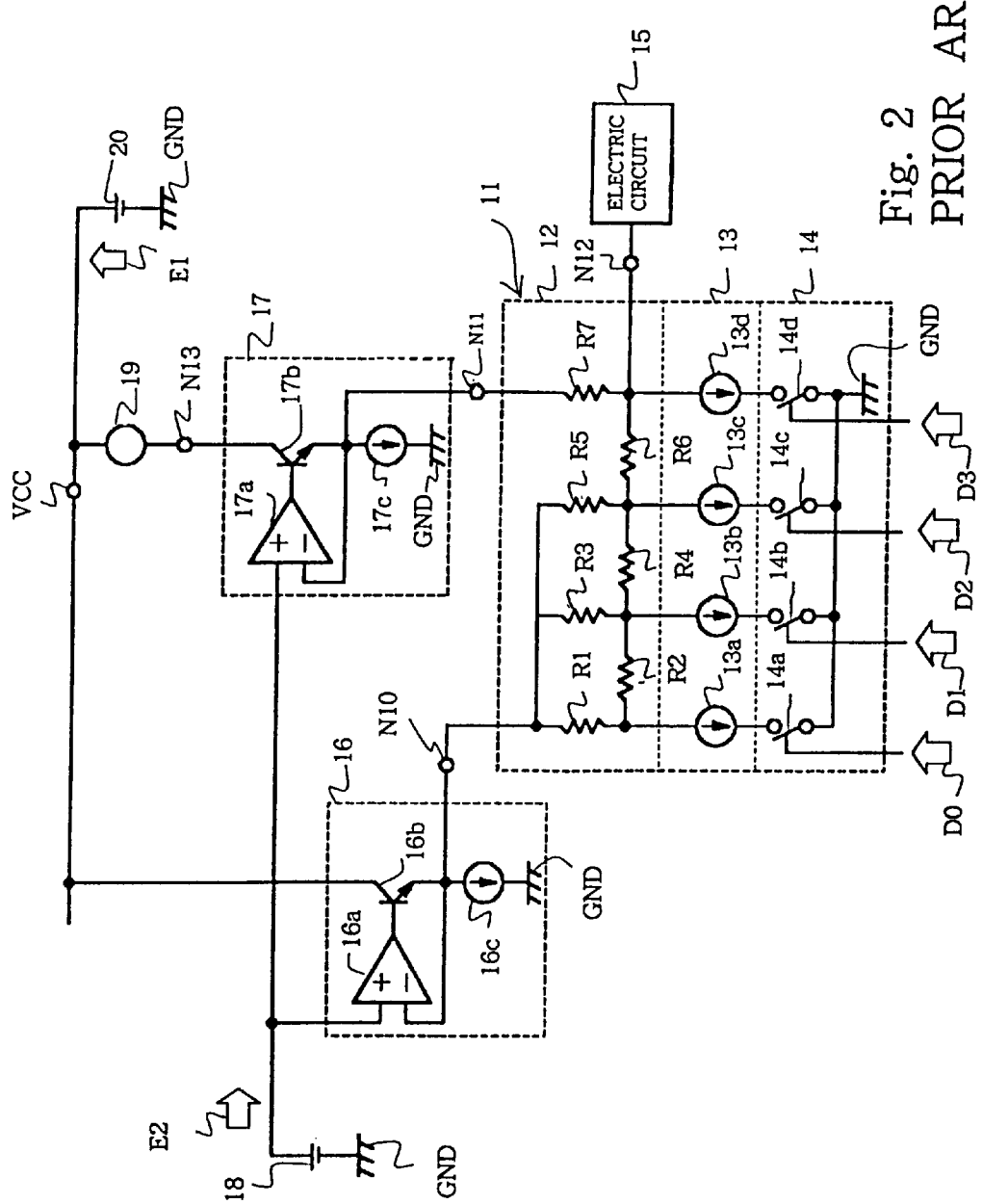
FIG. 2 is a circuit diagram showing the circuit configuration of the prior art digital-to-analog converter disclosed in Japanese Patent Publication of Examined Application No. 5-6375.
Figure 3:
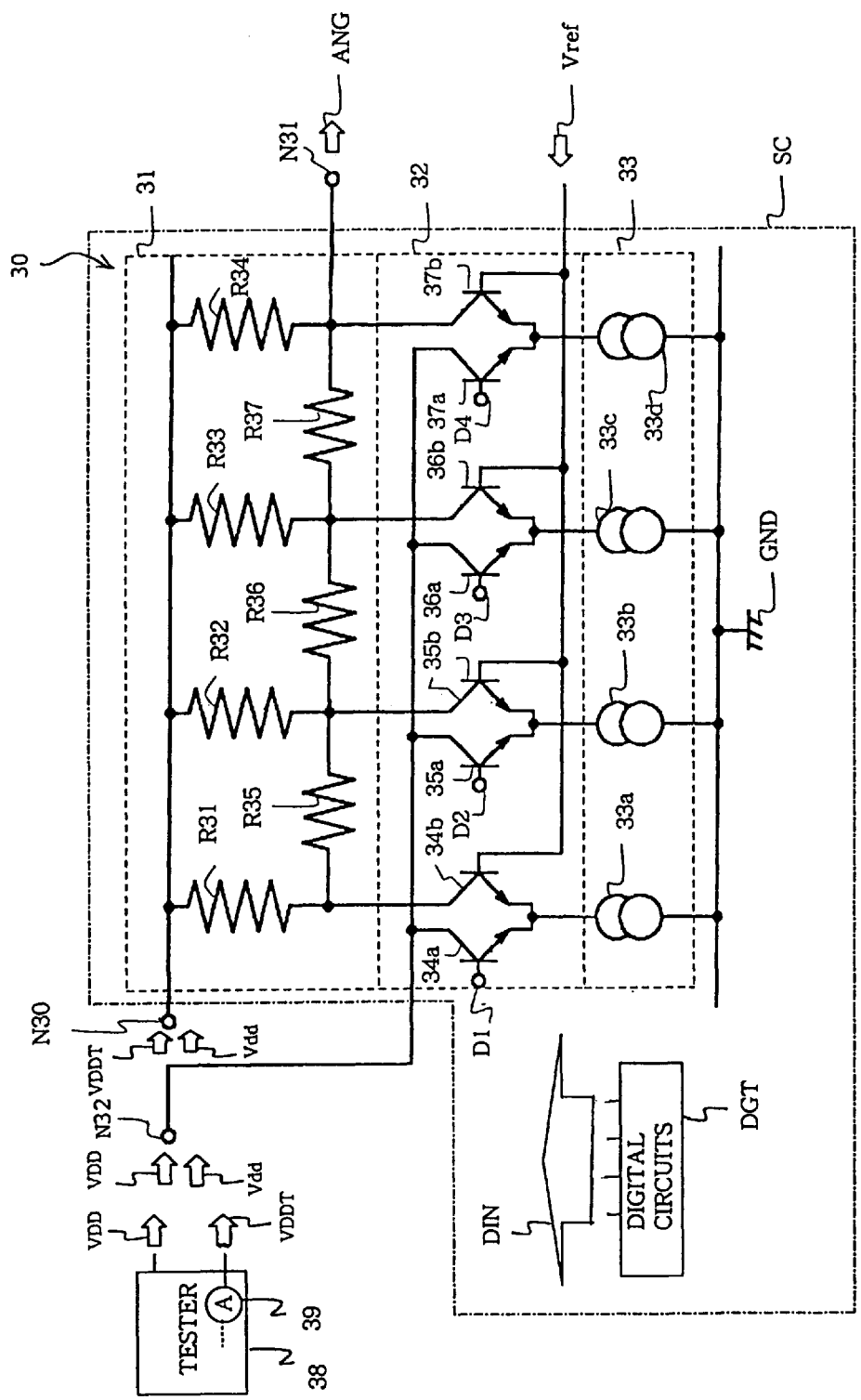
FIG. 3 is a circuit diagram showing the circuit configuration of a digital-to-analog converter according to the present invention.

Referring to FIG. 3 of the drawings, a digital-to-analog converter 30 embodying the present invention largely comprises a ladder-type resistor network 31, an array 32 of switching units connected to the ladder-type resistor network 31 and an array 33 of constant current sources connected between the array 32 of switching units 32 and a ground line GND. The digital-to-analog converter 30 is integrated on a semiconductor chip SC together with digital circuits DGT. Tough not shown in FIG. 1, the semiconductor chip SC is sealed in a package, and the semiconductor integrated circuit device is used in an electric circuit. In this instance, the digital circuits DGT supply a digital input signal DIN to the digital-to-analog converter 30.

The ladder-type resistor network 31 includes resistor elements R31/ R32/ R33/ R34 connected in parallel to a power supply node N30 and resistor elements R35/ R36/ R37 connected between the resistor elements R31/ R32/ R33/ R34, and the resistor elements R34/ R37 are connected to an output node N31. The resistor R32/ R33/ R34 is twice larger in resistance than the resistor R31/ R35/ R36/ R37. A power voltage VDDT or Vdd is supplied to the power supply node N30.

The array 32 of switching units includes pairs of n-p-n bipolar transistors 34a/ 34b, 35a/ 35b, 36a/ 36b and 37a/ 37b, and the n-p-n bipolar transistors 34a/ 35a/ 36a/ 37a are arranged in parallel to the n-p-n bipolar transistors 34b/ 35b/ 36b/ 37b, respectively. The n-p-n bipolar transistors 34b/ 35b/ 36b/ 37b have respective collector nodes connected to the resistor elements R31/ R32/ R33/ R34, respective base nodes supplied with a reference voltage Vref and respective emitter nodes connected to the emitter nodes of the associated n-p-n bipolar transistors 34b/ 35b/ 36b/ 37b. The other n-p-n bipolar transistors 34a/ 35a/ 36a/ 37a have respective collector nodes connected to a power supply node N32 and respective base nodes supplied with data bits D1/ D2/ D3/ D4 of the digital input signal DIN. The common emitter nodes are respectively connected through constant current sources 33a/ 33b/33c/ 33d of the array 33 to the ground line GND. A power voltage VDD or the power voltage Vdd is supplied to the power supply node NN32. The data bits are changed between a high level and a low level, and the reference voltage Vref is fixed to an intermediate level between the high level and the low level. For this reason, the n-p-n bipolar transistors 34a/ 35a/ 36a/ 37a and 34b/ 35b/ 36b/ 37b selectively turn on and off depending upon the voltage level of the data bit D1/ D2/ D3/ D4, and electric current flows directly from the power supply node N32 to the n-p-n bipolar transistors 34a/ 35a/ 36a/ 37a or from the power supply node N30 through the ladder-type resistor network 31 to the n-p-n bipolar transistors 34b/ 35b/ 36b/ 37b. As a result, the ladder-type resistor network 31 varies the amount of electric current depending upon the value of the digital input signal DIN, and an analog output signal ANG is taken out from the output node N31. The electric current flows through the n-p-n bipolar transistor 34a/ 35a/ 36a/ 37a or 34b/ 35b/ 36b/ 37b to the constant current source 33a/ 33b/ 33c/ 33d, and the amount of electric current passing through each constant current source 33a/ 33b/ 33c/ 33d is of the order of tens milliamperes.

When the semiconductor integrated circuit device is mounted on a circuit board together with other semiconductor devices, the semiconductor integrated circuit device and the other semiconductor devices form an electric circuit, the power voltage Vdd is supplied from a power supply line on the circuit board to both power supply nodes N30/ N32. The digital circuits DGT supply the digital input signal DIN to the base nodes of the n-p-n bipolar transistors 34a/ 35a/ 36a/ 37a, and the ladder-type resistor network 31 varies the amount of electric current depending upon the voltage level of the data bits D1/ D2/ D3/ D4. The analog output signal ANG is varied in inversely proportional to the amount of electric current, and is taken out from the output node N31. Thus, the circuit behavior of the digital-to-analog converter 31 is similar to that of the prior art digital-to-analog converter.

On the other hand, when the manufacturer tests the semiconductor integrated circuit device in the factory, a tester 38 independently supplies the power voltages VDD/ VDDT to the power supply nodes N30/ N32, and the tester 38 regulates the power voltages VDD/ VDDT to be equal to each other. An ammeter 39 is incorporated in the tester 38, and measures the amount of electric current supplied to the power supply node N30. The ammeter 39 has the resolution of the order of microampere. As described hereinbefore, the amount of electric current is stepwise varied together with the value of the digital input signal DIN. When the digital input signal DIN is (0000), the n-p-n bipolar transistors 34b/ 35b/ 36b/ 37b turn on, and the amount of electric current is maximized. On the other hand, when the digital input signal DIN is (1111), the n-p-n bipolar transistors 34a/ 35a/ 36a/ 37a turn on, and the ladder-type resistor network 31 minimizes the electric current flowing therethrough. The electric current is b ranched into sub-currents respectively flowing into the pairs of n-p-n bipolar transistors 34a/ 34b, 35a/ 35b, 36a/ 36b and 37a/ 37b, and the sub-currents flow into the constant current sources 33a/ 33b/ 33c/ 33d, respectively. As described hereinbefore, the sub-current is of the order of tens milliamperes, and the total amount of electric current is stepwise varied by tens milliamperes. For this reason, the accuracy of the ammeter 39 is of the order of 0.1 percent. The tester 38 sequentially changes the value of the digital input signal DIN, and the ammeter 39 measures the variation of the total amount of electric current. The tester 38 analyzes the variation, and diagnoses the digital-to-analog converter 30.

The ammeter 39 is a built-in component of the tester 38, and a conductive line therebetween has a low impedance. For this reason, the conductive line is less affected by noise, and the signal-to-noise ratio is very large. Thus, the built-in ammeter 39 enhances the accuracy of the measurement.

As will be understood from the foregoing description, the ammeter 39 measures the amount of electric current flowing into only the ladder-type resistor network 31, and the tester 38 diagnoses the digital-to-analog converter 30. Any bias source is required for the digital-to-analog converter 30, and the manufacturer can use a small semiconductor chip SC for the semiconductor integrated circuit device. Moreover, the electric currents are directly supplied from the power supply nodes N30/N32 to the ladder-type resistor network 31 and the n-p-n bipolar transistors 34a to 37a, respectively, and the amount of currents are never affected by the digital circuits DGT. For this reason, the digital-to-analog converter 30 is stable, and accurately converts the digital input signal DIN to the analog output voltage signal ANG.

Second Embodiment

Figure 4:
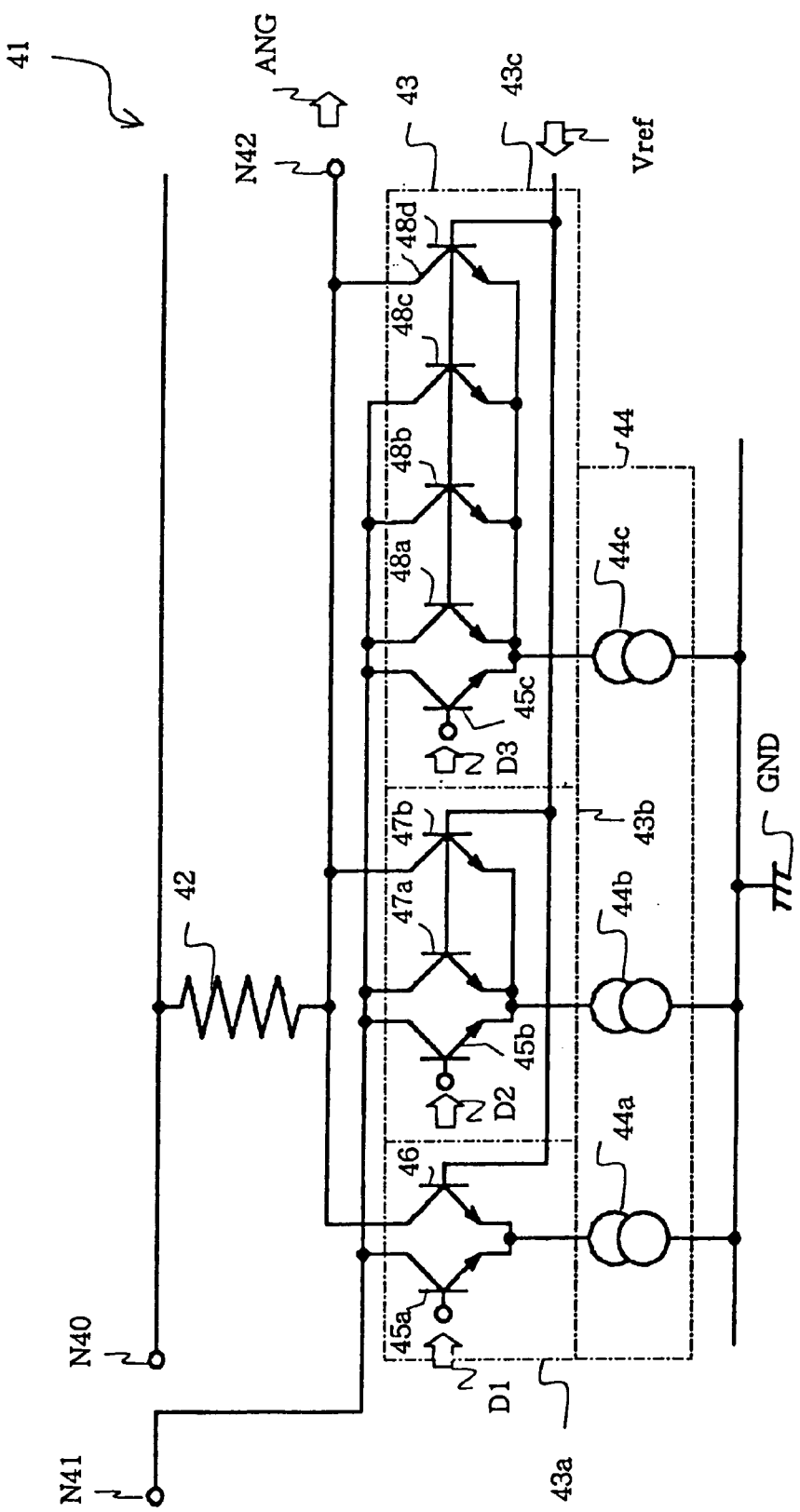
FIG. 4 is a circuit diagram showing the circuit configuration of another digital-to-analog converter according to the present invention.

FIG. 4 illustrates another digital-to-analog converter 41 embodying the present invention. The digital-to-analog converter 41 is integrated on a semiconductor chip (not shown) together with digital circuits (not shown), and the digital circuits and the digital-to-analog converter and the digital circuits as a whole constitute a semiconductor integrated circuit device. The digital-to-analog converter largely comprises a resistor element 42 connected to a power supply node N40, an array 43 of switching units connected to another power supply node N40 and the resistor 42 and an array 44 of constant current sources connected between the array 43 and a ground line GND. Three switching units 43a/ 43b/ 43c form the array 43. The switching units 43a/ 43b/ 43c have n-p-n bipolar transistors 45a/ 45b/ 45c, respectively, and the n-p-n bipolar transistors 45a/ 45b/ 45c have respective collector nodes connected to the power supply node N41, respectively base nodes supplied with data bits D1/ D2/ D3 of a digital input signal. The digital input signal may be supplied from digital circuits integrated together with the digital-to-analog converter 41 on a single semiconductor chip (not shown).

The switching units 43a/ 43b/ 43c further have an n-p-n bipolar transistor 46, a parallel combination of two n-p-n bipolar transistors 47a/ 47b and a parallel combination of four n-p-n bipolar transistors 48a/ 48b/ 48c/ 48d, respectively. The n-p-n bipolar transistors 47a and 48a - 48c have respective collector nodes connected to the power supply node N41, and the other n-p-n bipolar transistors 46, 47b and 48d have respective collector nodes connected to the resistor element 42. The n-p-n bipolar transistors 46, 47a–47b and 48a–48d have respective base nodes supplied with a reference voltage Vref and respective emitter nodes respectively connected to the emitter nodes of the n-p-n bipolar transistors 45a/ 45b/ 45c. The n-p-n bipolar transistors 46, 47a/ 47b and 48a/ 48b/ 48c/ 48d are equal in transistor size to one another, and the current driving capability of the n-p-n bipolar transistors 46/ 47b/ 48d is weighted by $½^n$ as will be described hereinlater. The value of "n" is 0 for the n-p-n bipolar transistor 46, 1 for the n-p-n bipolar transistor 47b and 2 for the n-p-n bipolar transistor 48d.

e data bits D1 D2/ D3 are varied between a high level and a low level, and the reference voltage is regulated to an intermediate level between the high level and the low level. The n-p-n bipolar transistor 45a/ 45b/ 45c and the associated n-p-n bipolar transistor or transistors 46/ 47a–47b/ 48a–48d selectively turn on and off depending upon the voltage level of the associated data bit D1/ D2/ D3. The electric current flows from the resistor element 42 into the n-p-n bipolar transistor or transistors 46/ 47b/ 48d, and the potential level at an output node N42 is varied depending upon the total amount of electric current. The potential level at the output node N42 is taken out as an analog output voltage signal ANG.

Three constant current sources 44a/ 44b/ 44c are connected between the common emitter nodes of the array 43 and the ground line GND, and have respective current driving capabilities equal to one another. As described hereinbefore, the n-p-n bipolar transistors 46, 47a–47b and 48a–48d are equal in transistor size, and are connected to the constant current sources 44a/ 44b/ 44c, respectively. When the data bit D2 or D3 is in the low level, the n-p-n bipolar transistors 47a–47b or 48a–48d turn on. Although the electric current flows from the power supply node N41 to the n-p-n bipolar transistor 47a and 48a–48c, the resistor element 42 supplies the electric current to the n-p-n bipolar transistor 47b and the n-p-n bipolar transistor 48d, and the amount of electric current passing through the n-p-n bipolar transistor 47b or 48d is a half or a quarter of the electric current passing through the n-p-n bipolar transistor 46.

When the digital input signal is (111), the n-p-n bipolar transistors 45a/ 45b/ 45c turn on, and the other n-p-n bipolar transistors 46, 47a–47b and 48a–48d turn off. For this reason, no electric current flows through the resistor element 42, and the analog output voltage signal ANG is equal in voltage level to the power voltage level at the power supply node N40. If the digital input signal is decreased from (111) to (000), the amount of electric current flowing through the resistor element 42 is stepwise increased, and the analog output voltage signal ANG is also stepwise decreased.

When the semiconductor integrated circuit device is mounted on a printed circuit board (not shown), the semiconductor integrated circuit device forms a part of an electric system, and the power supply nodes N401 N41 are connected to a power supply line (not shown) formed on the printed circuit board.

The manufacturer tests the digital-to-analog converter in the factory after completion of the fabrication process. The tester 38 (see FIG. 3) is connected to the power supply nodes N40 and N41, and the power voltage is independently supplied through the power supply nodes N40/ N41 to the resistor element 42 and the n-p-n bipolar transistors 45a–45c, 47a and 48a–48c, respectively. The tester 48 sequentially changes the value of the digital input signal D1/ D2/ D3, and the ammeter 39 measures the amount of electric current flowing into the resistor element 42. The tester 48 checks the variation of the electric current to see whether the digital-to-analog converter 41 is defective or non-defective.

The tester 48 accurately diagnoses the digital-to-analog converter 41 on the basis of the variation of the electric current without any bias sources, and the digital-to-analog converter 41 achieves all the advantages of the first embodiment. The digital-to-analog converter 41 requires only one resistor element 42. This feature is desirable, because the digital-to-analog converter 41 occupies the real estate narrower than that of the digital-to-analog converter 30, because the digital-to-analog conversion is not affected by any difference in resistance between the resistor elements R31 to R37.

Third Embodiment

Figure 5:
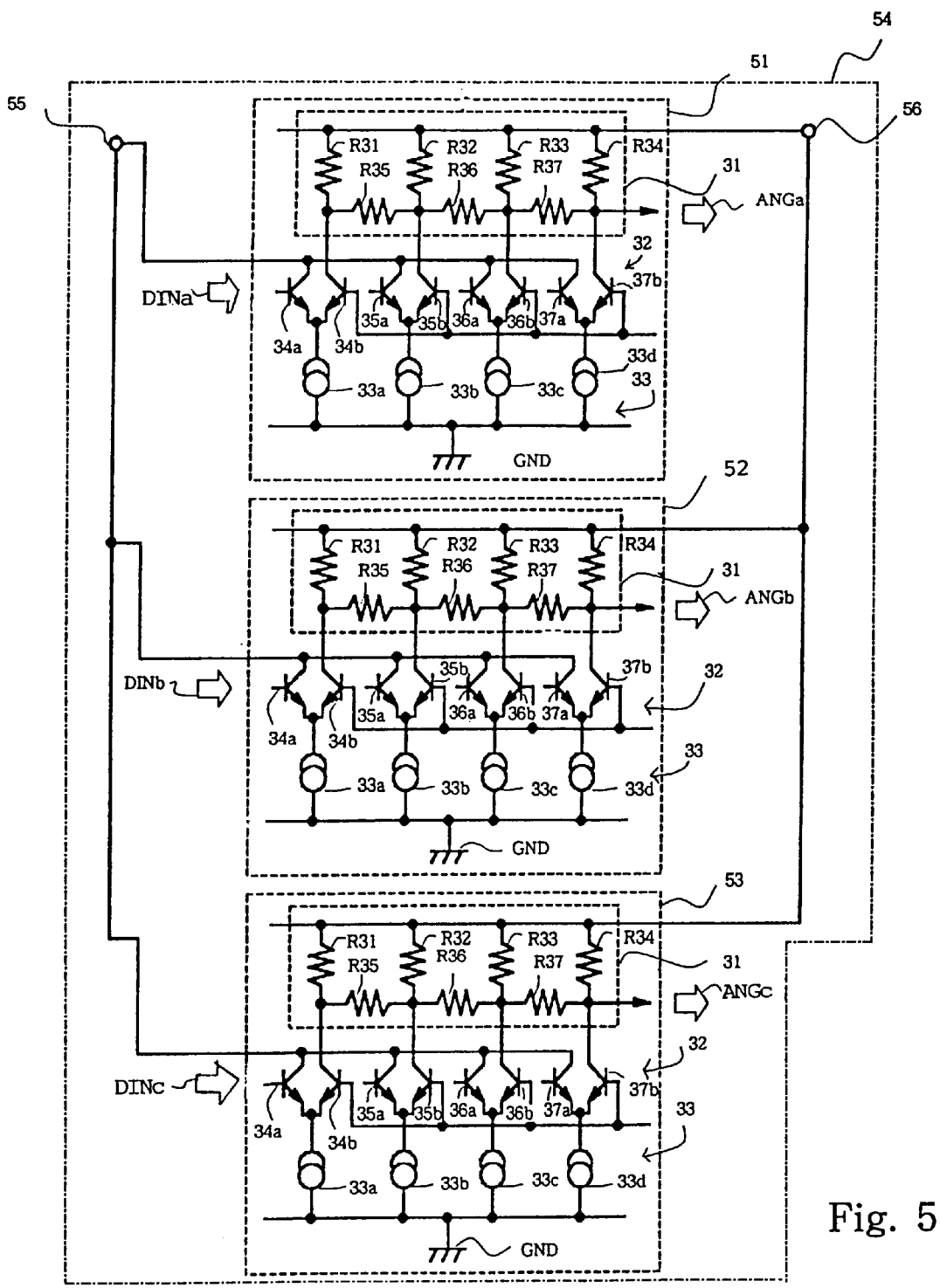
FIG. 5 is a circuit diagram showing the circuit configuration of yet another digital-to-analog converter according to the present invention.

Turning to FIG. 5 of the drawings, plural digital-to-analog converters 51/ 52/ 53 are integrated on a semiconductor chip 54. The semiconductor chip 54 is sealed in a package, and forms a semiconductor integrated circuit device. The digital-to-analog converters 51/ 52/ 53 are similar in circuit configuration to the digital-to-analog converter 30. For this reason, circuit components of each digital-to-analog converter 51/ 52/ 53 are labeled with the references designating the corresponding circuit components of the digital-to-analog converter 30 without detailed description.

Input digital signals DINa/ DINb/ DINc are supplied to the digital-toanalog converters 51/ 52/ 53, respectively, and make the n-p-n bipolar transistors 34a/ 34b, 35a/ 35b, 36a/ 36b and 37a/ 37b of the digital-to-analog converters 51/ 52/ 53 to turn on and off as similar to the input digital signal DIN of the digital-to-analog converter 30. The input digital signals DINa/ DINb/ DINc may be supplied from digital circuits (not shown) fabricated on the semiconductor chip 54. Otherwise, the digital circuits may be separately mounted on a printed circuit board. The digital-to-analog converters 51/ 52/ 53 convert the input digital signals DINa/ DINb/ DINc to analog output voltage signals ANGa/ ANGb/ ANGc, respectively. The circuit behavior is similar to that of the digital-to-analog converter 30, and no further description incorporated hereinbelow for the sake of simplicity.

A power supply node 55 is connected to the collector nodes of all the n-p-n bipolar transistors 34a to 37b of the digital-to-analog converters 51/ 52/ 53, and the ladder-type resistor networks 31 are connected to another power supply node 56. When the semiconductor integrated circuit device is mounted on a printed circuit board (not shown), the semiconductor integrated circuit device forms a part of an electric system, and the power supply nodes 55/ 56 are connected to a power supply line (not shown) formed on the printed circuit board.

The manufacturer tests the digital-to-analog converters 51/ 52/ 53 after completion of the fabrication process. The tester 38 is connected to the power supply nodes 55/ 56, and fixes the digital input signals DINb/ DINc to (1,1,1,1). The electric current flows from the power supply node 55 through the n-p-n bipolar transistors 34a/ 35a/ 36a/ 37a of the digital-to-analog converters 52/ 53, and any electric current flows from the other power supply node 56 to the digital-to-analog converters 52/ 53. Then, the tester 38 sequentially changes the value of the digital input signal DINa, and the ammeter 39 measures the amount of electric current. The tester checks the variation of the electric current to see whether the digital-to-analog converter 51 is defective or not.

Subsequently, the tester 38 fixes the digital input signals DINa/ DINc to (1,1,1,1). The electric current flows from the power supply node 55 through the n-p-n bipolar transistors 34a/ 35a/ 36a/ 37a of the digital-to-analog converters 51/ 53, and any electric current flows from the other power supply node 56 to the digital-to-analog converters 51/ 53. Then, the tester 38 sequentially changes the value of the digital input signal DINb, and the ammeter 39 measures the amount of electric current. The tester 38 checks the variation of the electric current to see whether the digital-to-analog converter 51 is defective or not.

Finally, the tester 38 fixes the digital input signals DINa/ DINb to (1,1,1,1). The electric current flows from the power supply node 55 through the n-p-n bipolar transistors 34a/ 35a/ 36a/ 37a of the digital-to-analog converters 51/ 52, and any-electric current flows from the other power supply node 56 to the digital-to-analog converters 51/ 52. Then, the tester 38 sequentially changes the value of the digital input signal DINc, and the ammeter 39 measures the amount of electric current. The tester 38 checks the variation of the electric current to see whether the digital-to-analog converter 53 is defective or not.

The diagnosis may be carried out after the measurement of the variation of current for all the digital-to-analog converters 51/ 52/ 53.

In this way, even though the power supply nodes 55/ 56 are shared between the digital-to-analog converters 51/ 52/ 53, the tester 38 individually diagnoses the digital-to-analog converters 51/ 52/ 53 by using the power supply nodes 55/ 56. Thus, even if the plural digital-to-analog converters 51/ 52/ 53 are integrated on the semiconductor chip 54, the manufacturer does not increase the power supply nodes 55/ 56 and the pins connected thereto.

As will be appreciated from the foregoing description, the digital-to--analog converter according to the present invention has two power supply nodes, which independently supply the electric current through the resistor means to the switching elements and directly to the other switching elements pared with the switching elements. When the value of the input digital signal is sequentially changed, only the amount of electric current supplied through the resistor means is stepwise changed. The digital-to-analog converter is testable on the basis of the variation of the electric current. The electric characteristics of the digital-to-analog converter are expressed by the amount of current, and a tester accurately diagnoses the digital-to-analog converter. Any bias sources are not required. This results in that the digital-to-analog converter is stable in the electric characteristics and that the occupation area assigned to the digital-to-analog converter is narrow. Even if plural digital-to-analog converters are integrated on a semiconductor chip, the two power supply nodes or the two power supply pins are shared between the plural digital-to-analog converters, and the increase of test pin is minimized.

Moreover, the power supply nodes N30/ N32, 40/ 41 or 55/ 56 are used for the electric power supply after the semiconductor chip SC/ 54 is mounted on a circuit board for an electric circuit. There is not any additional pin used in the measurement only. Thus, the manufacturer does not need to increase the pins.

Although particular embodiments of the present invention have been shown and described, it will be apparent to those skilled in the art that various changes and modifications may be made without departing from the spirit and scope of the present invention.

For example, more than four data bits may form a digital input signal. The transistors are not limited to an n-p-n bipolar transistor. A p-n-p bipolar transistor or a field effect transistor is available for the switching units. The digital-to-analog converter according to the present invention may be supplied with the digital input signal from another digital circuit. The digital-to-analog converter 30/ 41 may be a small scale integration.

In the second embodiment, the resistor element 42, the array 43 of switching elements and the array 44 of constant current sources are formed on the same semiconductor chip. However, only the arrays 43/ 44 may be integrated on a semiconductor chip. In this instance, the resistor element 42 is fabricated as a discrete circuit component, and is mounted on the printed circuit board separately from the semiconductor chip. The power supply nodes 56/ 56 may be shared between more than three digital-to-analog converters 51/ 52/ 53. The digital-to-analog converters 51/ 52/ 53 may have the circuit configuration similar to that of the digital-to-analog converter 41.

What is claimed is:

1. A digital-to-analog converter comprising:
   a first power supply node supplied with a first electric current from an electric power source outside thereof;
   a second power supply node electrically isolated from said first power supply node, and supplied with a second electric current from said electric power source;
   an output node for supplying an analog output signal therefrom to outside thereof;
   a resistor circuit connected between said first power supply node and said output node for producing said analog output signal from said first electric current;
   a plurality of constant current sources connected in parallel to a third power supply node different in potential level from said first power supply node and said second power supply node; and
   a switching circuit including
      a plurality of first switching elements connected between said second power supply node and said plurality of constant current sources and respectively supplied with data bits of a digital input signal for changing current paths thereof between on-state and off-state depending upon said data bits and
      a plurality of second switching elements respectively paired with said plurality of first switching elements, connected between said resistor circuit and said plurality of constant current sources and supplied with a reference voltage for changing current paths thereof between said on-state and said off-state complementarily to said associated first switching elements.

2. The digital-to-analog converter as set forth in claim 1, in which said resistor circuit includes first resistor elements having respective first ends connected in parallel to said first power supply node and respective second ends and second resistor elements connected between said second ends of said first resistor elements, and said output node is connected to one of said second nodes.

3. The digital-to-analog converter as set forth in claim 1, in which a plurality of first switching transistors and a plurality of second switching transistors respectively serve as said plurality of first switching elements directly connected to said second power supply node and said plurality of second switching elements respectively connected to said second nodes.

4. The digital-to-analog converter as set forth in claim 1, in which said resistor circuit includes first resistor elements having respective first ends connected in parallel to said first power supply node and respective second ends and second resistor elements connected between said second ends of said first resistor elements,
   said output node is connected to one of said second nodes, and
   a plurality of first switching transistors and a plurality of second switching transistors respectively serve as said plurality of first switching elements directly connected to said second power supply node and said plurality of second switching elements respectively connected to said second nodes.

5. The digital-to-analog converter as set forth in claim 4, in which bipolar transistors serve as said plurality of first switching transistors and said plurality of second switching transistors, respectively.

6. The digital-to-analog converter as set forth in claim 5, in which said bipolar transistors are of the n-p-n type.

7. The digital-to-analog converter as set forth in claim 1, in which said resistor circuit is implemented by a single resistor element.

8. The digital-to-analog converter as set forth in claim 1, in which said plurality of second switching elements are plural transistor groups each containing $2^n$ transistors connected in parallel to an associated one of said plurality of first switching elements where n is zero or a natural number incremented from one, and one of said $2^n$ transistors of each transistor group is connected between said resistor circuit and an associated one of said plurality of constant current sources.

9. The digital-to-analog converter as set forth in claim 1, in which said resistor circuit is implemented by a single resistor element, said plurality of second switching elements are plural transistor groups each containing $2^n$ transistors connected in parallel to an associated one of said plurality of first switching elements where n is zero or a natural number incremented from one, and one of said $2^n$ transistors of each transistor group is connected between said resistor element and an associated one of said plurality of constant current sources.

10. The digital-to-analog converter as set forth in claim 9, in which said plurality of first switching elements and said $2^n$ transistors of each transistor group are implemented by bipolar transistors, respectively.

11. The digital-to-analog converter as set forth in claim 10, in which said bipolar transistors are of the n-p-n type.

12. A semiconductor integrated circuit device fabricated on a single semiconductor substrate comprising a digital-to-analog converter including
a first power supply node supplied with a first electric current from an electric power source outside thereof,
a second power supply node electrically isolated from said first power supply node and supplied with a second electric current from said electric power source,
an output node for supplying an analog output signal therefrom to outside thereof,
a plurality of constant current sources connected in parallel to a third power supply node different in potential level from said first power supply node and said second power supply node, and
a switching circuit having
a plurality of first switching elements connected between said second power supply node and said plurality of constant current sources and respectively supplied with data bits of a digital input signal for changing current paths thereof between on-state and off-state depending upon said data bits and
a plurality of second switching elements respectively paired with said plurality of first switching elements, connected between a resistor circuit connected between said first power supply node and said output node and said plurality of constant current sources and supplied with a reference voltage for changing current paths thereof between said on-state and said off-state complementarily to said associated first switching elements.

13. The semiconductor integrated circuit device as set forth in claim 12, in which said resistor circuit is fabricated on said semiconductor substrate.

14. The semiconductor integrated circuit device as set forth in claim 13, in which said resistor circuit includes first resistor elements having respective first ends connected in parallel to said first power supply node and respective second ends and second resistor elements connected between said second ends of said first resistor elements, and said output node is connected to one of said second nodes.

15. The digital-to-analog converter as set forth in claim 13, in which said resistor circuit includes first resistor elements having respective first ends connected in parallel to said first power supply node and respective second ends and second resistor elements connected between said second ends of said first resistor elements,
said output node is connected to one of said second nodes, and
a plurality of first switching transistors and a plurality of second switching transistors respectively serve as said plurality of first switching elements directly connected to said second power supply node and said plurality of second switching elements respectively connected to said second nodes.

16. The semiconductor integrated circuit device as set forth in claim 13, in which said resistor circuit is implemented by a single resistor element.

17. The semiconductor integrated circuit as set forth in claim 13, in which said resistor circuit is implemented by a single resistor element, said plurality of second switching elements are plural transistor groups each containing $2^n$ transistors connected in parallel to an associated one of said plurality of first switching elements where n is zero or a natural number incremented from one, and one of said $2^n$ transistors of each transistor group is connected between said resistor element and an associated one of said plurality of constant current sources.

18. The semiconductor integrated circuit device as set forth in claim 12, in which said resistor circuit is provided outside of said semiconductor substrate.

19. The semiconductor integrated circuit device as set forth in claim 18, in which said resistor circuit is implemented by a single resistor element.

20. The semiconductor integrated circuit device as set forth in claim 18, in which said resistor circuit is implemented by a single resistor element, said plurality of second switching elements are plural transistor groups each containing $2^n$ transistors connected in parallel to an associated one of said plurality of first switching elements where n is zero or a natural number incremented from one, and one of said $2^n$ transistors of each transistor group is connected between said resistor element and an associated one of said plurality of constant current sources.

21. The semiconductor integrated circuit device as set forth in claim 12, in which at least one digital-to-analog converter similar in circuit configuration to said digital-to-analog converter is further integrated on said semiconductor substrate.

22. The semiconductor integrated circuit device as set forth in claim 12, further comprising at least one digital circuit for producing said digital input signal.

23. A method for testing a digital-to-analog converter comprising a first power supply node supplied with a first electric current, a second power supply node electrically isolated from said first power supply node and supplied with a second electric current, an output node for supplying an analog output signal therefrom to outside thereof, a resistor circuit connected between said first power supply node and said output node for producing said analog output signal from said first electric current, a plurality of constant current sources connected in parallel to a third power supply node and a switching circuit including a plurality of first switching elements connected between said second power supply node and said plurality of constant current sources and respectively supplied with data bits of a digital input signal for changing current paths thereof between on-state and off-state depending upon said data bits and a plurality of second switching elements respectively paired with said plurality of first switching elements, connected between said resistor circuit and said plurality of constant current sources and supplied with a reference voltage for changing current paths thereof between said on-state and said off-state complementarily to said associated first switching elements, comprising the steps of:

a) connecting said first power supply node and said second power supply node to a first source of electric power and said third power supply node to a second source of electric power different in power level from said first source of electric power;

b) changing the value of said digital input signal for measuring a variation of said first electric current; and c) diagnosing said digital-to-analog converter on the basis of said variation of said first electric current.

24. The method as set forth in claim 23, in which said first source of electric power, said second source of electric power, a source of said digital input signal and an ammeter are incorporated in a tester, and said ammeter is connected between said first source of electric power and said first power supply node.

25. The method as set forth in claim 23, in which said digital-to-analog converter is integrated on a semiconductor substrate together with at least one digital-to-analog converter similar in circuit configuration to said digital-to-analog converter and sharing said first power supply node and said second power supply node with said digital-to-analog converter.

26. The method as set forth in claim 25, further comprising the steps of d) supplying the digital input signal to said at least one digital-to-analog converter in order to cause the plurality of second switching elements of said at least one digital-to-analog converter to turn off before said step a), and e) supplying said digital input signal to said digital-to-analog converter in order to cause said plurality of second switching elements of said digital-to-analog converter to turn off after said step c), and f) repeating said step b) and c) for said at least one digital-to-analog converter.

* * * * *

UNITED STATES PATENT AND TRADEMARK OFFICE
CERTIFICATE OF CORRECTION

PATENT NO. : 6,198,418 B1
DATED : March 6, 2001
INVENTOR(S) : Satoshi Ishizuka

It is certified that error appears in the above-identified patent and that said Letters Patent is hereby corrected as shown below:

Please correct the Foreign Application Priority Data by omitting 9-102208, April 18, 1997, JAPAN. Also please add 08-256156, OCTOBER 1, 1996, JAPAN, and 04-207453, JULY 29, 1992, JAPAN to the Reference Cited Section.

Signed and Sealed this

Seventh Day of August, 2001

Attest:

*Nicholas P. Godici*

NICHOLAS P. GODICI
*Attesting Officer*   *Acting Director of the United States Patent and Trademark Office*